United States Patent
Cho (12)

(10) Patent No.: US 6,238,964 B1
(45) Date of Patent: May 29, 2001

(54) METHOD OF FABRICATING A CAPACITOR IN A SEMICONDUCTOR DEVICE

(75) Inventor: Bok-Won Cho, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/291,305

(22) Filed: Apr. 15, 1999

(30) Foreign Application Priority Data

Jan. 29, 1999 (KR) .................................... 99-2876

(51) Int. Cl.⁷ ................................................ H01L 21/8242
(52) U.S. Cl. .............................. 438/240; 438/3; 438/396; 438/683
(58) Field of Search .............................. 438/3, 240, 253, 438/256, 396, 399, 643, 683, 255, 398, 238, 381, 648

(56) References Cited

U.S. PATENT DOCUMENTS 6,103,566 * 8/2000 Tamaru et al. ...................... 438/683
6,103,570 * 8/2000 Shandhu et al. ..................... 438/398

* cited by examiner

*Primary Examiner*—Charles Bowers
*Assistant Examiner*—Yennhu B. Huynh
(74) *Attorney, Agent, or Firm*—Fleshner & Kim, LLP

(57) ABSTRACT

The present invention relates to a capacitor in a semiconductor device and a fabricating method thereof, more particularly, to an upper electrode of a capacitor and a fabricating method thereof which reduce leakage current and secure the stable thickness of the upper electrode of a three-dimensional capacitor by inserting an extra TiN layer free from Cl at an interface between an upper electrode and a dielectric layer in a capacitor, of which dielectric layer is made of $Ta_2O_5$ and of which upper electrode is made of TiN, for a semiconductor memory device. The present invention includes a lower electrode on a predetermined portion of a semiconductor substrate, a dielectric layer on a surface of the lower electrode, a first upper electrode on a surface of the dielectric layer wherein the first upper electrode consists of a substance maintaining the dielectric layer intact, and a second upper electrode on the first upper electrode. And, the present invention includes the steps of forming a lower electrode on a predetermined portion of a semiconductor substrate, forming a dielectric layer on a surface of the lower electrode, forming a first upper electrode on a surface of the the dielectric layer wherein the first upper electrode is made of a substance maintaining the dielectric layer intact, and forming a second upper electrode on the first upper electrode wherein the second upper electrode is made of a substance of which step coverage is good.

16 Claims, 4 Drawing Sheets

METHOD OF FABRICATING A CAPACITOR IN A SEMICONDUCTOR DEVICE

BACKGROUND OF THE INVENTION

1. Field of Invention

The present invention relates to a capacitor in a semiconductor device and a fabricating method thereof, more particularly, to an upper electrode of a capacitor and a fabricating method thereof which reduce leakage current and secure the stable thickness of the upper electrode of a three-dimensional capacitor by inserting an extra TiN layer free from Cl at an interface between an upper electrode and a dielectric layer in a capacitor, of which dielectric layer is made of $Ta_2O_5$ and of which upper electrode is made of TiN, for a semiconductor memory device.

2. Discussion of Related Art

Cell areas are reduced as a semiconductor device needs ultra-high integrity. Thus, many studies for increasing the capacitance of a capacitor are being developed. There are various ways of increasing the capacitance such as forming a stacked or trench typed three dimensional structure, whereby a surface area of a dielectric layer is increased.

In order to constitute a cell area in a DRAM fabrication, transistors and the like are formed on a semiconductor substrate, storage and plate electrodes of polycrystalline silicon and a dielectric layer are formed wherein the dielectric layer lies between the electrodes, and metal wires are formed to connect the devices one another. When an upper electrode and a dielectric layer of a capacitor of a metal-insulator-metal or metal-insulator-metal are formed with TiN containing Cl and $Ta_2O_5$, respectively, the optimization of annealing the dielectric layer of $Ta_2O_5$ for improving the characteristic of the dielectric layer and another optimization of forming the upper electrode without Cl are proposed to control the leakage current of a capacitor.

TiN is mainly used for an upper electrode of a capacitor provided that a dielectric layer is formed with $Ta_2O_5$. MO(metal-organic)CVD-TiN is formed by using metal-organic source such as TDMAT or TDEAT by CVD (chemical vapor deposition). And, $TiCl_4$—TiN having a polycrystalline structure is formed by reacting $TiCl_4$ of an inorganic source with $NH_3$.

$TiCl_4$—TiN, as a substance for an upper electrode, is superior to MOCVD-TiN because step coverage of $TiCl_4$—TiN is better than that of MOCVD-TiN. Besides, when a TiN layer is formed by TDMAT of the metal-organic source, carbons contained in the TiN layer migrates into a dielectric layer of $Ta_2O_5$. Thereby, the characteristic of the dielectric layer is ruined. When a dielectric layer is formed with $Ta_2O_5$ and an upper electrode is formed with a $TiCl_4$—TiN layer by CVD, Cl remains at an interface between the $Ta_2O_5$ layer and the TiN layer as well as inside the TiN layer. Cl breaks down a portion of the $Ta_2O_5$ layer to form a path of leakage current with Ta which is a good conductive substance of metal. Thereby, the characteristic of the dielectric layer of $Ta_2O_5$ is ruined when a capacitor is operated.

FIG. 1 to FIG. 3 show cross-sectional views of fabricating a capacitor in a semiconductor device according to a related art.

Referring to FIG. 1, an impurity region 11 used as a source or drain region is formed by doping a predetermined portion of a silicon substrate 10 of p typed semiconductor heavily with n typed impurities such as As, P or the like.

A silicon oxide layer 12 as an insulating interlayer 12 is formed on the silicon substrate by chemical vapor deposition (hereinafter abbreviated CVD).

A contact hole exposing a surface of the impurity region 11 is formed by removing a portion of the insulating interlayer 12 by photolithography.

A conductive layer of W is formed on the insulating interlayer 12 to fill up the contact hole by CVD. A contact plug 13, which is connected electrically to the impurity region 11 and fills up the contact hole, is formed by etching back the conductive layer of W until a surface of the insulating interlayer is exposed.

A polycrystalline silicon layer doped with impurities is deposited on the insulating interlayer 12 including an exposed surface of the plug 13 by CVD. Then, a storage electrode 14 is formed by patterning the polycrystalline silicon layer by photolithography of dry etch. In this case, the storage electrode 4 may be patterned as one of various shapes such as a box, crown, cylinder, fin and the like.

Referring to FIG. 2, a dielectric layer 15 is formed by depositing $Ta_2O_5$, of which dielectric constant is excellent, on an exposed surface of the storage electrode 14. Then, the characteristics of the dielectric layer 15 are improved by annealing the dielectric layer under oxygen ambience. This is because the dielectric layer 15 mainly consisting of $Ta_2O_{5-x}$ needs to be saturated into $Ta_2O_5$ to provide an ideal dielectric constant.

Referring to FIG. 3, an upper electrode which is a plate electrode is formed by depositing a TiN layer 16 on the dielectric layer 15 including the insulating interlayer 12. In this case, the TiN layer 16 is made of $TiCl_4$—TiN which is formed by reacting $TiCl_4$ of an inorganic source with $NH_3$ on the dielectric layer 15.

Accordingly, when the upper electrode is formed with a $TiCl_4$—TiN layer by CVD, Cl remains at an interface between the $Ta_2O_5$ layer and the TiN layer as well as inside the TiN layer, thereby ruining the characteristic of the dielectric layer of $Ta_2O_5$.

Moreover, stress-induced leakage current is brought about by tensile stress amounting to 1E10 to 9E10 dyne/$cm^2$ due to the grain structure of the $TiCl_4$—TiN layer.

SUMMARY OF THE INVENTION

Accordingly, the present invention is directed to a capacitor in a semiconductor device and a fabricating method thereof that substantially obviates one or more of the problems due to limitations and disadvantages of the related art.

The object of the present invention is to provide a capacitor in a semiconductor device and a fabricating method thereof which reduce leakage current and secure the stable thickness of the upper electrode of a three-dimensional capacitor by inserting an extra TiN layer free from Cl at an interface between an upper electrode and a dielectric layer in a capacitor, of which dielectric layer is made of $Ta_2O_5$ and of which upper electrode is made of TiN, for a semiconductor memory device to improve the characteristics of an interface between $Ta_2O_5$/TiN.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a lower electrode on a predetermined portion of a semiconductor substrate, a dielectric layer on a surface of the lower electrode, a first upper electrode on a surface of the dielectric layer wherein the first upper electrode consists of a substance maintaining the dielectric layer intact, and a second upper electrode on the first upper electrode.

In another aspect, the present invention includes a lower electrode on a predetermined portion of a semiconductor substrate, a $Ta_2O_5$ layer on a surface of the lower electrode, a first upper electrode on a surface of the $Ta_2O_5$ layer wherein the first upper electrode consists of a TiN layer which does not contain Cl, and a second upper electrode on the first upper electrode wherein the second upper electrode consists of a substance of which step coverage is good.

In another aspect, the present invention includes the steps of forming a lower electrode on a predetermined portion of a semiconductor substrate, forming a dielectric layer on a surface of the lower electrode, forming a first upper electrode on a surface of the the dielectric layer wherein the first upper electrode is made of a substance maintaining the dielectric layer intact, and forming a second upper electrode on the first upper electrode wherein the second upper electrode is made of a substance of which step coverage is good.

In a further aspect, the present invention includes the steps of forming a lower electrode on a predetermined portion of a semiconductor substrate, forming a dielectric layer made of $Ta_2O_5$ on a surface of the lower electrode, forming a first upper electrode on a surface of the the dielectric layer wherein the first upper electrode is made of a substance which does not contain Cl, and forming a second upper electrode on the first upper electrode wherein the second upper electrode is made of a substance of which step coverage is good.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Figure 1:
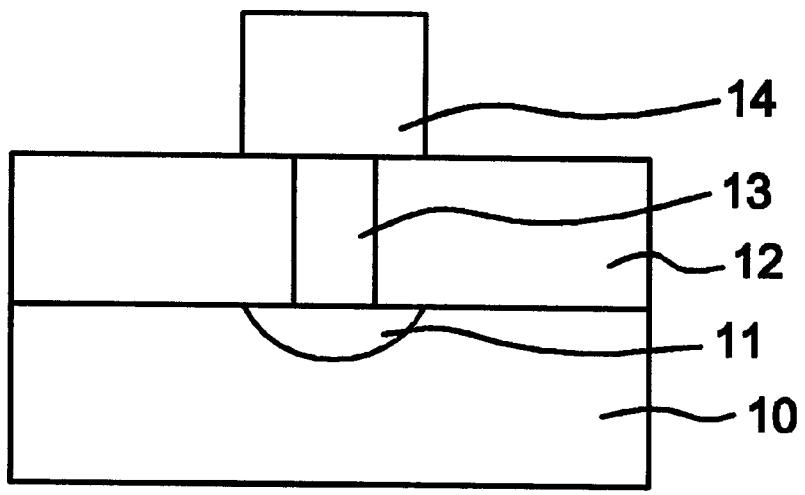
FIG. 1 to FIG. 3 show cross-sectional views of fabricating a capacitor in a semiconductor device according to a related art.
Figure 2:
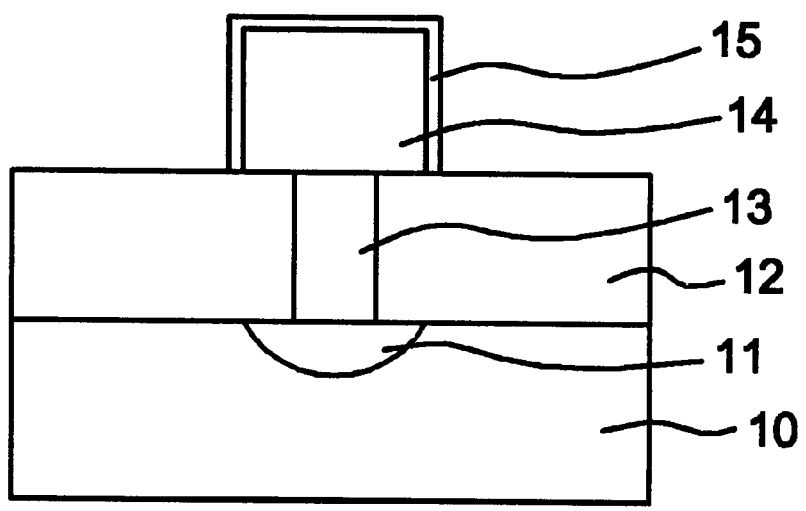
Figure 3:
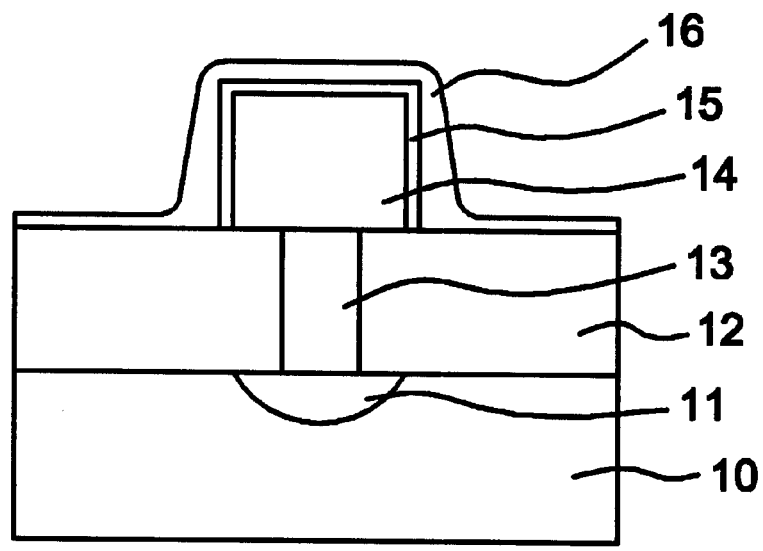

Reference will now be made in detail to the preferred embodiment of the present invention, examples of which are illustrated in the accompanying drawings.

The present invention, which relates to a technology of using a high dielectric layer of $Ta_2O_5$ for a capacitor in a semiconductor memory device, improves leakage current of a capacitor and secures thickness of an upper electrode to prevent electrical problems in a three dimensional structure such as a cylinder by excluding Cl from an interface between a $Ta_2O_5$ layer of the dielectric layer and a TiN layer of the upper electrode.

When a dielectric layer of $Ta_2O_5$ is formed on a lower electrode which is a storage electrode and an upper electrode of $TiCl_4$—TiN is deposited on the dielectric layer by CVD, Cl remains at an interface between the $Ta_2O_5$ layer and the TiN layer. The remaining Cl extracts Ta to ruin the characteristics of leakage current in the dielectric layer on operating the capacitor. Accordingly, Cl remaining at the interface and the TiN layer should be reduced or eliminated.

In order to reduce Cl, the temperature of depositing the TiN layer by CVD is elevated or the TiN layer is treated by $NH_3$. Able to reduce the amount of Cl in the Ti layer to a certain degree, such methods are unable to eliminate Cl in the interface between the $Ta_2O_5$ and TiN layers completely. When a dielectric layer of $Ta_2O_5$ is formed and an upper electrode of a plate electrode is formed by depositing $TiCl_4$—TiN of which step coverage is excellent by CVD, the mechanism of ruining leakage current due to Cl is explained in the following description.

Cl in the TiN layer of an upper electrode deposited by CVD exists as a formation of $TiCl_x$ and reacts with $Ta_2O_5$ at an interface between the $Ta_2O_5/TiCl_4$—TiN layers by a heat process over 650° C. Once the heat process proceeds, $Ta_2O_5$ is dissociated into $TiO_x$ and Ta as well as Cl is outgassed. A chemical reaction formula is as the following.

$$TiCl_x + Ta_2O_5 \rightarrow TiO_x + Ta + Cl\uparrow$$

As shown in the formula, Ta formed in the interface between the $Ta_2O_5$ and $TiCl_4$—TiN layers becomes an electrical path, whereby the characteristics of the dielectric layer of $Ta_2O_5$ is ruined.

As the $Ta_2O_5$ layer of which dielectric constant is high is dissociated into other substances, the characteristic of a dielectric substance is somewhat lost to lower the dielectric constant of the dielectric layer as well as leakage current increases.

Accordingly, a new method of forming an upper electrode, which excludes Cl in the interface between the $Ta_2O_5$ and $TiCl_4$—TiN layers and secures sufficient thickness of the upper electrode in a 3-dimensional capacitor, is asked. Moreover, the $TiCl_4$—TiN layer brings about stress-induced leakage current generated from tensile stress amounting to 1E10 to 9E10 dyne/cm² due to the grain structure of the $TiCl_4$—TiN layer. For this reason, the thickness of the $TiCl_4$—TiN layer has to be minimized as far as possible within electrical limitation so as to prevent the leakage current caused by the stress in the layer.

A storage electrode as a lower electrode is formed for the fabrication of a capacitor in a semiconductor device. And, a dielectric layer is formed by depositing an $Ta_2O_5$ layer on the lower electrode.

Before forming a TiN layer as an upper electrode in use of $TiCl_4$ as a source, a new TiN layer containing no Cl is formed on the dielectric layer. Then, a $TiCl_4$—TiN layer of which step coverage is good is deposited on the new TiN layer to the required thickness to complete an upper electrode. The new TiN layer is formed by one of the following methods.

First, the TiN layer is formed by MOCVD in use of an organometallic substance such as TDMAT or TDEAT.

Second, the TiN layer is formed by physical vapor deposition(hereinafter abbreviated PVD). Third, The TiN layer is formed by nitrizing a Ti layer under $NH_3$ or $N_2$ ambience wherein the Ti layer is formed by CVD.

A leading substance for an upper capacitor using a $Ta_2O_5$ layer as a dielectric layer is TiN which is formed by CVD in use of $TiCl_4$ as a source material. Unfortunately, the above TiN ruins leakage current as Cl existing inside the TiN layer and in the interface between the $Ta_2O_5$ and TiN layers extracts Ta on the following heat process. Particularly, Cl in the interface between the $Ta_2O_5$ and TiN layers mainly affects leakage current. Thus, the major concern of the present invention is exclude Cl in the interface.

Figure 6:
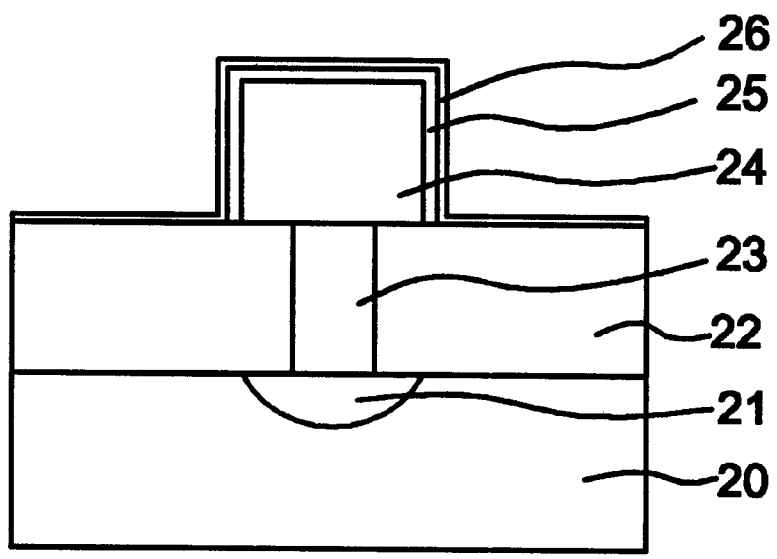
Figure 7:
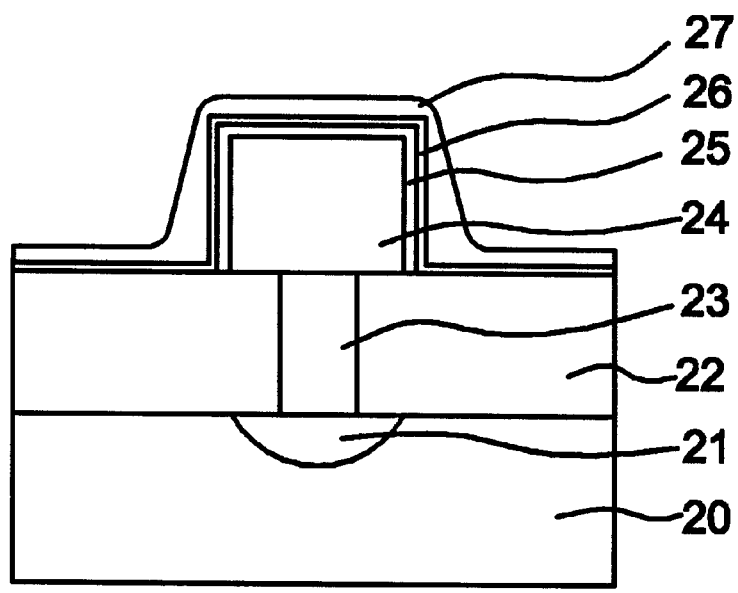
Figure 8:
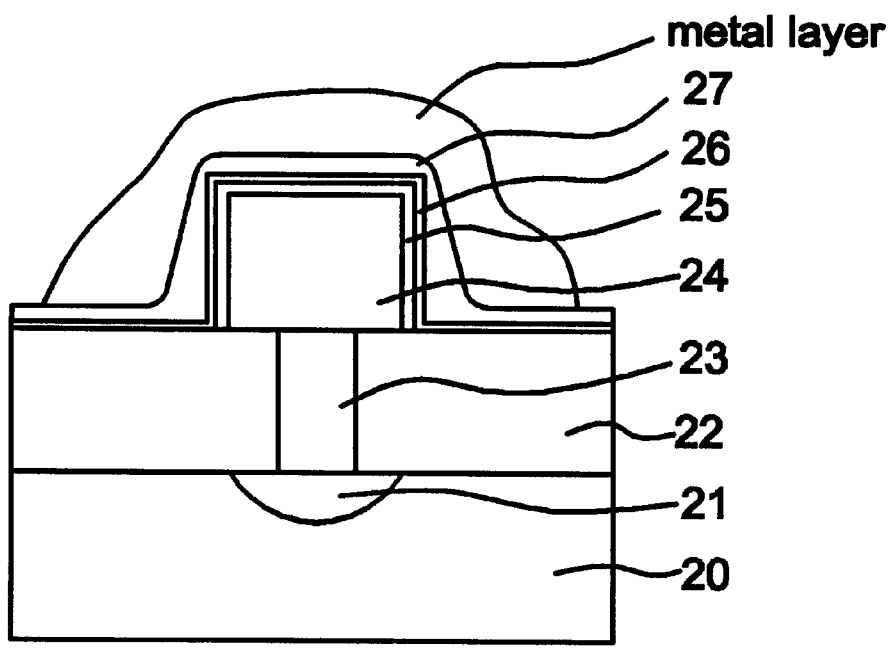
FIG. 8 shows a cross-sectional view of a capacitor according to the present invention.

FIG. 4 to FIG. 7 show cross-sectional views of fabricating a capacitor in a semiconductor device according to the present invention, and FIG. 8 shows a cross-sectional view of a capacitor according to the present invention.

Figure 4:
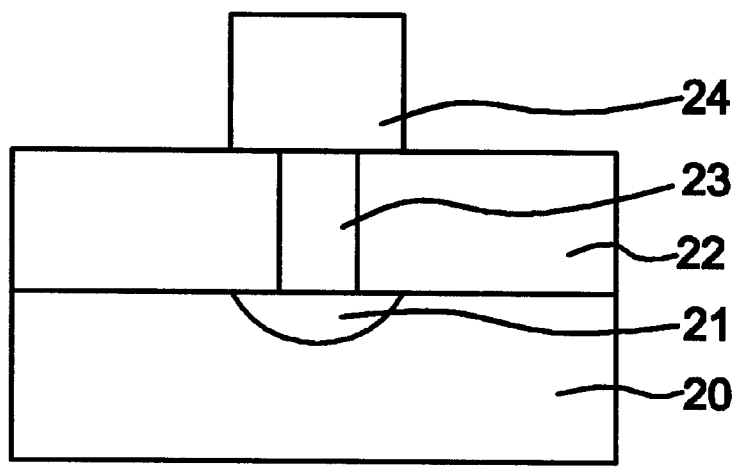
FIG. 4 to FIG. 7 show cross-sectional views of fabricating a capacitor in a semiconductor device according to the present invention.

Referring to FIG. 4, an impurity region 21 used as a source or drain region is formed by doping a predetermined portion of a silicon substrate 10 of first(p) typed semiconductor heavily with second(n) typed impurities such as As, P or the like.

A silicon oxide layer 22 as an insulating interlayer 22 is formed on the silicon substrate 20 by CVD. After the insulating interlayer 22 has been coated with photoresist, a photoresist pattern(not shown in the drawing) exposing a portion of the insulating interlayer 22 over the impurity region 21 is defined by exposure and development of the photoresist.

A contact hole exposing a portion of the impurity region 21 is formed by etching anisotropically the insulating interlayer 22 which is not covered with the photoresist pattern. Then, the photoresist pattern is removed.

A conductive layer of W is formed on the insulating interlayer 22 to fill up the contact hole by CVD or sputtering. A contact plug 23, which is connected electrically to the impurity region 21 and fills up the contact hole, is formed by etching back the conductive layer of W until a surface of the insulating interlayer 22 is exposed.

A polycrystalline silicon layer doped with impurities is deposited on the insulating interlayer 22 including an exposed surface of the plug 23 by CVD. Then, a storage electrode 24 is formed by patterning the polycrystalline silicon layer by photolithography of dry etch. In this case, the storage electrode 24 may be patterned as one of various shapes such as a box, crown, cylinder, fin and the like.

A thin nitride layer, which is about 10 Å thick and not shown in the drawing, is formed by nitrizing the surface of the storage electrode 24 by rapid thermal nitrization (hereinafter abbreviated RTN) to improve leakage current.

Besides, the storage electrode 24 may be formed by depositing and patterning a metal layer to fabricate a capacitor of a metal-insulator-metal (hereinafter abbreviated MIM) structure. When this MIM structure is to be formed, the RTN treatment of the storage electrode is skipped.

Figure 5:
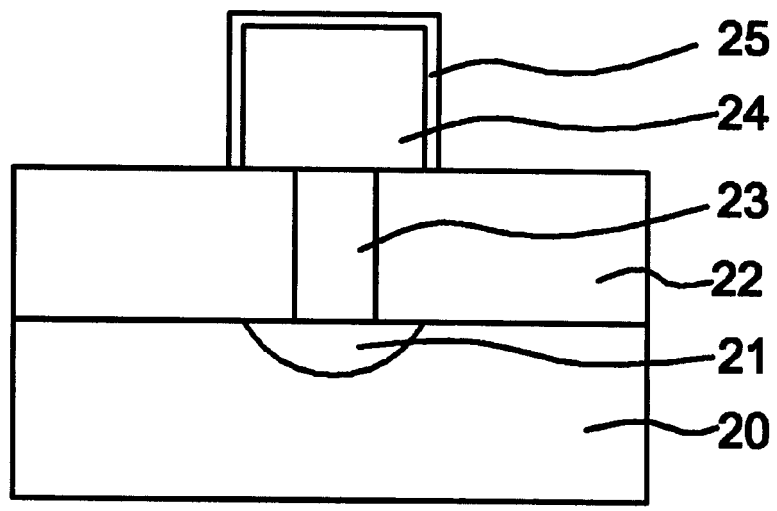

Referring to FIG. 5, a dielectric layer 25 is formed by depositing $Ta_2O_5$, of which dielectric constant is excellent, on the storage electrode 24 on which the nitride film may have been formed. Then, the characteristics of the dielectric layer 25 are improved by annealing the dielectric layer under oxygen ambience. This is because the dielectric layer 25 mainly consisting of $Ta_2O_{5-x}$ needs to be saturated into $Ta_2O_5$ to provide an ideal dielectric constant.

Referring to FIG. 6, a first upper electrode 26 consisting of TiN containing no Cl is formed on the dielectric layer 25 by one of the following methods.

First, a TiN layer as the first upper electrode 26 is formed by MOCVD in use of an organometallic substance such as TDMAT or TDEAT.

Second, a TiN layer as the first upper electrode 26 is formed by PVD.

Third, a TiN layer as the first upper electrode 26 is formed by nitrizing a Ti layer under $NH_3$ or $N_2$ ambience wherein the Ti layer is formed by CVD.

When the first upper electrode 26 is formed by MOCVD in use of an organometallic substance such as TDMAT or TDEAT, the compressive stress of the TiN layer is (−)9 order $dyne/cm^2$ while the tensile stress of the other TiN layer of a second upper electrode which is going to be formed in the following step is (+)10 order $dyne/cm^2$. Thus, the stresses are almost canceled out each other to reduce leakage current thereon.

Moreover, The TiN layer of the first upper electrode 26 which is formed by using TDMAT or TDEAT as a source has the column structure, while the other TiN layer of the second TiN layer of the second upper electrode which is going to be formed by using $TiCl_4$ as a source has a polycrystalline structure. Thus, MOCVD-TiN having the column structure or PVD-TiN which has the column structure and of which grain size is relatively bigger is superior to $TiCl_4$—TiN in aspect of electrical characteristics.

In the related art, Cl existing in the interface between the $Ta_2O_5$ and TiN layers ruins the leakage current in the dielectric layer of $Ta_2O_5$.

However, in the embodiment of the present invention, leakage current is reduced by preventing Cl from remaining in the TiN layer as the TiN layer is formed by using a source containing no Cl. Referring to FIG. 7, a second upper electrode 27 is formed on the first upper electrode 26 by forming a new TiN layer of which step coverage is good in use of $TiCl_4$ as a source substance. As not shown in the drawing, a W layer by CVD or another TiN layer by sputtering may be formed on the second upper electrode 27 so that resistance for operating a device is secured as well as the total topography of the device is improved by securing the thickness of the upper electrodes.

FIG. 8 shows a cross-sectional view of a capacitor according to the present invention. Referring to FIG. 8, an impurity region 21 lies at a predetermined portion of a silicon substrate 20 of first typed semiconductor.

An insulating interlayer 22 of oxide having a contact hole which exposes the impurity region 21 lies on the silicon substrate 20.

An electrically-conductive plug 23 of W fills up the contact hole.

A lower electrode 24, which consists of conductive semiconductor or metal and has a box shape contacts with the plug 23, lies on the insulating interlayer 22.

A dielectric layer 25 consisting of $Ta_2O_5$ covers the lower electrode 24.

A first upper electrode 26 of TiN containing no Cl lies on the dielectric layer 25, and a second upper electrode 27 of TiN formed by using $TiCl_4$ as a source substance lies on the first upper electrode 26.

The first upper electrode 26 of TiN is formed by MOCVD in use of an organometallic substance such as TDMAT or TDEAT, by PVD or by nitrizing a Ti layer under $NH_3$ or $N_2$ ambience wherein the Ti layer is formed by CVD.

As Cl is excluded from the TiN layer 26 and the interface between the $Ta_2O_5$ and TiN layers 25 and 26, no Ta is extracted by the following heat process. Thus, leakage current is greatly reduced As not shown in the drawing, a W layer by CVD or another TiN layer by sputtering may be formed on the second upper electrode 27 so that resistance for operating a device is secured as well as the total topography of the device is improved by securing the thickness of the upper electrodes.

Accordingly, the present invention reduces leakage current caused by Ta extracted by the following heat process due to Cl.

Moreover, the present invention reduces another leakage current caused by canceling out stresses each other because the compressive stress of the TiN layer is $(-)9$ order dyne/$cm^2$ while the tensile stress of the other TiN layer of a second upper electrode $(+)10$ order dyne/$cm^2$.

It will be apparent to those skilled in the art that various modifications and variations can be made in a capacitor in a semiconductor device and a fabricating method thereof of the present invention without departing from the spirit or scope of the inventions. Thus, it is intended that the present invention cover the modifications and variations of this invention provided they come within the scope of the appended claims and equivalents.

What is claimed is:

1. A method of fabricating a capacitor in a semiconductor device:

forming a lower electrode on a predetermined portion of a semiconductor substrate;

forming a dielectric layer on a surface of the lower electrode; forming an upper electrode on a surface of the dielectric layers wherein the forming the upper electrode comprises, forming a first upper electrode of a first TiN layer, which is formed by physical vapor deposition (PVD) thereby maintaining the dielectric layer intact, and forming a second upper electrode on the first upper electrode, wherein the second upper electrode is made of a second TiN layer of which step coverage is good; and forming a metal layer on the upper electrode.

2. The method of fabricating a capacitor in a semiconductor device according to claim 1, wherein the lower electrode is formed with metal or conductive semiconductor.

3. The method of fabricating a capacitor in a semiconductor device according to claim 1, wherein the dielectric layer is formed with $Ta_2O_5$.

4. A method of fabricating a capacitor in a semiconductor device according to claim 1, wherein the second TiN layer of the second upper electrode has a different source material, which contains Cl, than the first PVD TiN layer.

5. The method of fabricating a capacitor in a semiconductor device according to claim 1, wherein the first PVD TiN layer of the first upper electrode does not contain Cl, and wherein the second upper electrode is formed with TiN in use of $TiCl_4$ as a source material.

6. The method of fabricating a capacitor in a semiconductor device according to claim 1, wherein the metal layer secures resistance for a device operation and thickness required for the second upper electrode.

7. The method of fabricating a capacitor in a semiconductor device according to claim 6, wherein the metal layer is formed by depositing a tungsten layer or by forming a TiN layer by sputtering.

8. The method of fabricating a capacitor in a semiconductor device according to claim 2, the method further comprising the step of inserting an insulating layer for leakage current between the dielectric layer and the lower electrode made of the semiconductor.

9. A method of fabricating a capacitor in a semiconductor device:

forming a lower electrode on a predetermined portion of a semiconductor substrate;

forming a dielectric layer made of $Ta_2O_5$ on a surface of the lower electrode;

forming an upper electrode on the dielectric layer, comprising, forming a first upper electrode on a surface of the dielectric layers, wherein the first upper electrode is made of TiN using a source material which does not contain Cl, and is capable of maintaining the dielectric layer intact to decrease a leakage current, and forming a second upper electrode on the first upper electrode, wherein the second upper electrode is made of TiN using $TiCl_4$ as a source material of the second upper electrode; and forming a metal layer on the second upper electrode.

10. The method of fabricating a capacitor in a semiconductor device according to claim 9, wherein the first upper electrode is made of a TiN layer formed by metal-organic chemical vapor deposition in use of an organometallic substance as a source material.

11. The method of fabricating a capacitor in a semiconductor device according to claim 9, wherein the first upper electrode is made of a TiN layer which is formed by physical vapor deposition.

12. The method of fabricating a capacitor in a semiconductor device according to claim 9, wherein the first upper electrode is formed by depositing a Ti layer by chemical vapor deposition and by nitrizing the Ti layer under $NH_3$ or $N_2$ ambience.

13. The method of fabricating a capacitor in a semiconductor device according to claim 9, wherein the second upper electrode is formed with a TiN layer of which step coverage is good.

14. The method of fabricating a capacitor in a semiconductor device according to claim 9, wherein the metal layer secures resistance for a device operation and thickness required for the second upper electrode.

15. The method of fabricating a capacitor in a semiconductor device according to claim 14, wherein the metal layer is formed by depositing a tungsten layer or by forming a TiN layer by sputtering.

16. A method of fabricating a capacitor in a semiconductor device, comprising:

forming a lower electrode on a predetermined portion of a semiconductor substrate;

forming a dielectric layer on a surface of the lower electrode;

forming an upper electrode on the dielectric layer, wherein the forming the upper electrode consists of, forming a first upper electrode on the surface of the dielectric layer, the first upper electrode consisting of a first TiN layer, which does not contain Cl to maintain the dielectric layer intact and is capable of decreasing a leakage current, and forming a second tipper electrode on the first upper electrode, wherein the second upper electrode consists of a second TiN layer formed using TiCl, as a source material of which step coverage is good; and forming a metal layer on the second upper electrode.

* * * * *